United States Patent
Han

(10) Patent No.: US 10,510,925 B2
(45) Date of Patent: Dec. 17, 2019

(54) LIGHT-EMITTING DEVICE AND LIGHTING SYSTEM COMPRISING SAME

(71) Applicant: LG INNOTEK CO., LTD., Seoul (KR)

(72) Inventor: Young Hun Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 171 days.

(21) Appl. No.: 15/546,941

(22) PCT Filed: Feb. 12, 2016

(86) PCT No.: PCT/KR2016/001421
§ 371 (c)(1),
(2) Date: Jul. 27, 2017

(87) PCT Pub. No.: WO2016/133310
PCT Pub. Date: Aug. 25, 2016

(65) Prior Publication Data
US 2018/0013034 A1 Jan. 11, 2018

(30) Foreign Application Priority Data
Feb. 16, 2015 (KR) .................. 10-2015-0023144

(51) Int. Cl.
*H01L 33/14* (2010.01)
*F21K 9/232* (2016.01)
(Continued)

(52) U.S. Cl.
CPC .......... *H01L 33/145* (2013.01); *F21K 9/232* (2016.08); *F21K 9/235* (2016.08); *F21K 9/237* (2016.08);
(Continued)

(58) Field of Classification Search
None
See application file for complete search history.

(56) References Cited

U.S. PATENT DOCUMENTS

2011/0240957 A1* 10/2011 Okuno
2012/0236573 A1* 9/2012 Yamamoto .............. F21V 25/02
362/311.02
(Continued)

FOREIGN PATENT DOCUMENTS

JP 2008-277539 A 11/2008
JP 2013-69795 A 4/2013
(Continued)

OTHER PUBLICATIONS

Zhang, Y. Y. "Performance enhancement of blue light-emitting didoes with a special designe AlGaN/GaN superlattice electron-blocking layer" Appl. Phys. Lett. 99 Nov. 28, 2011 pp. 221103-1-221103-3 (Year: 2011).*
(Continued)

*Primary Examiner* — Asok K Sarkar
*Assistant Examiner* — Grant S Withers
(74) *Attorney, Agent, or Firm* — Birch, Stewart, Kolasch & Birch, LLP

(57) ABSTRACT

Embodiments relate to a light emitting device, a light emitting device package, and a lighting system comprising the same. The light emitting device according to embodiments may comprise: a first conductivity-type semiconductor layer; an active layer on the first conductivity-type semiconductor layer; an electron blocking layer on the active layer; and a second conductivity-type semiconductor layer on the electron blocking layer. The electron blocking layer may comprise an $In_xAl_yGa_{1-x-y}N$ based superlattice layer (wherein $0 \leq x \leq 1$, $0 \leq y \leq 1$).

18 Claims, 6 Drawing Sheets

(51) Int. Cl.
*F21K 9/235* (2016.01)
*F21K 9/237* (2016.01)
*H01L 33/02* (2010.01)
*H01L 33/06* (2010.01)
*H01L 33/32* (2010.01)
*H01L 33/04* (2010.01)
*F21Y 115/10* (2016.01)

(52) U.S. Cl.
CPC ............ *H01L 33/025* (2013.01); *H01L 33/04* (2013.01); *H01L 33/06* (2013.01); *H01L 33/32* (2013.01); *F21Y 2115/10* (2016.08)

(56) References Cited

U.S. PATENT DOCUMENTS

| | | |
|---|---|---|
| 2013/0069034 A1 | 3/2013 | Hirayama |
| 2013/0069035 A1 | 3/2013 | Kikuchi et al. |
| 2014/0264371 A1* | 9/2014 | Debray .................. H01L 33/32 257/76 |
| 2017/0110628 A1* | 4/2017 | Shatalov ............... G06F 17/505 |

FOREIGN PATENT DOCUMENTS

| | | |
|---|---|---|
| KR | 10-2008-0010137 A | 1/2008 |
| KR | 10-2012-0118076 A | 10/2012 |
| KR | 10-2012-0139402 A | 12/2012 |
| KR | 10-2013-0129683 A | 11/2013 |
| KR | 10-2014-0075318 A | 6/2014 |

OTHER PUBLICATIONS

Yang, Y. "Enhanced performance of InGaN light-emitting diodes with InGaN/GaN superlattice and graded-composition InGaN/GaN supperlattice interlayers" Phys. Stat. Sol. A No. 7, May 2014 pp. 1640-1644 (Year: 2014)*
Yu, C. "Effects of InGaN Layer thickness of AlGaN/InGaN superlattice electron blocking layer on the overall efficiency and efficiency droops of GaN-based light emitting diodes" Optics Exp. vol. 22, No. S3 May 19, 2014 pp. A663-A670 (Year: 2014).*

* cited by examiner

【Figure 1】
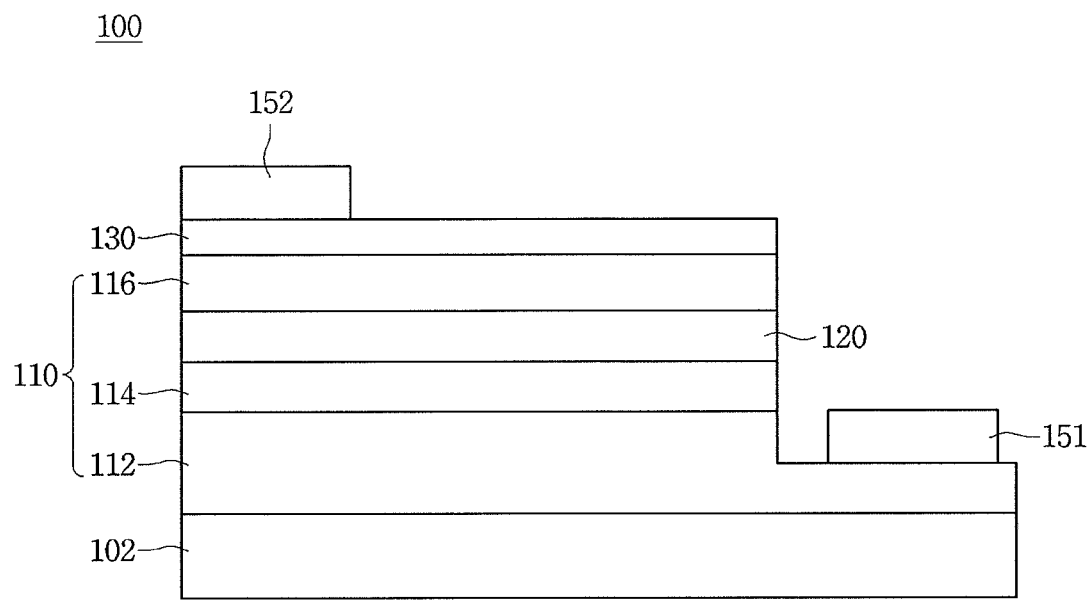
【Figure 2】
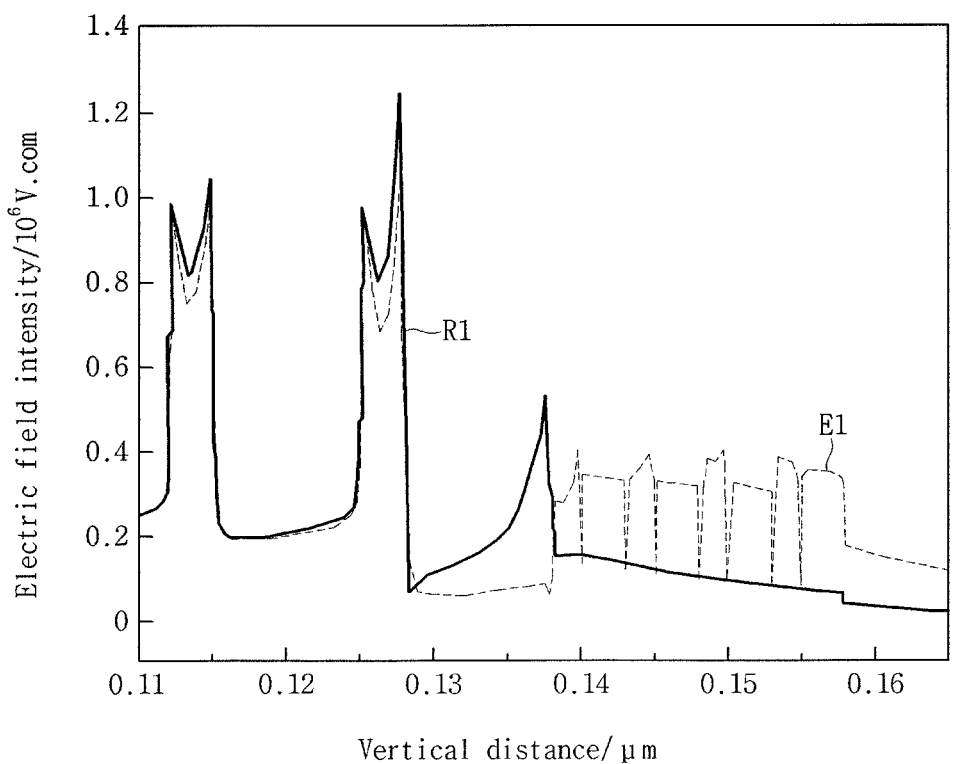

[Figure 3]
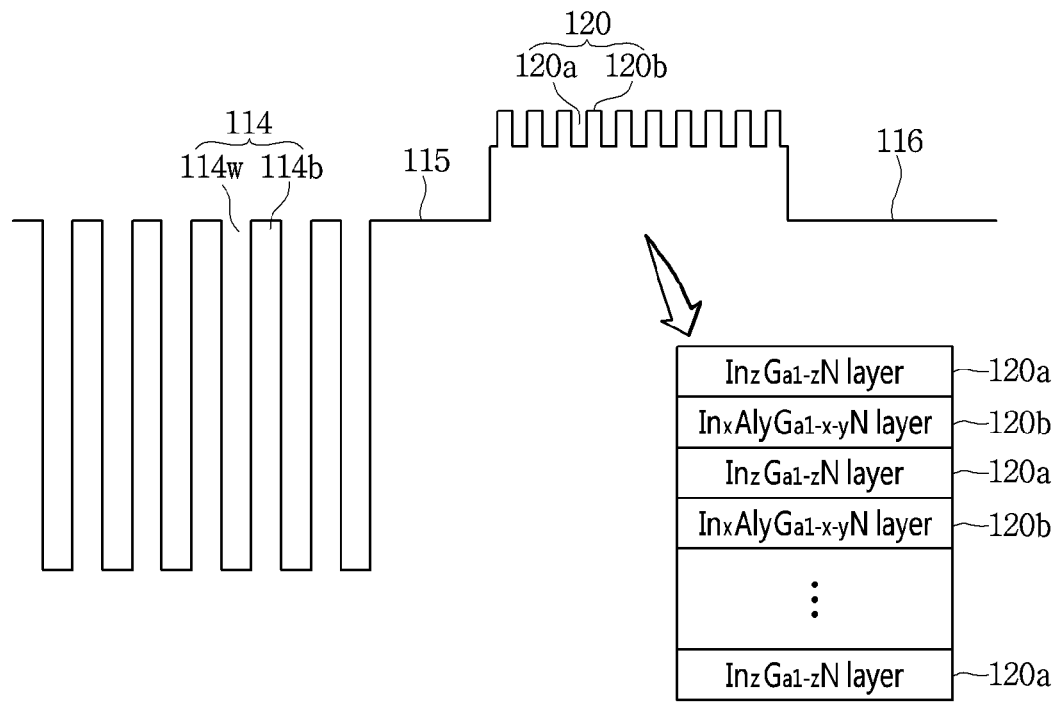
[Figure 4]
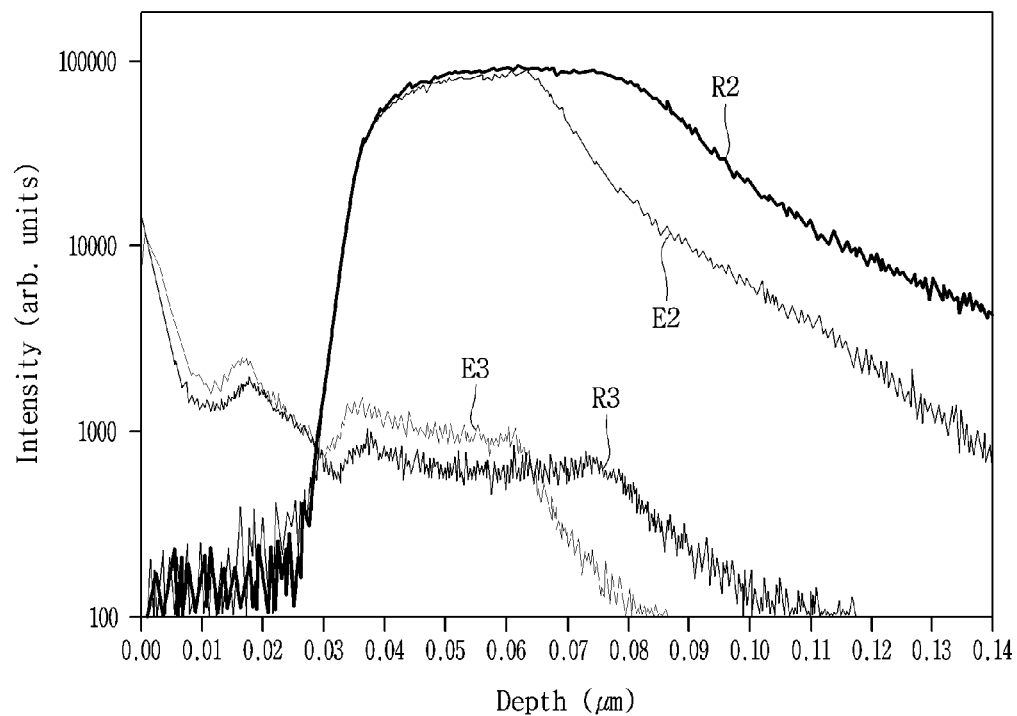

【Figure 5】
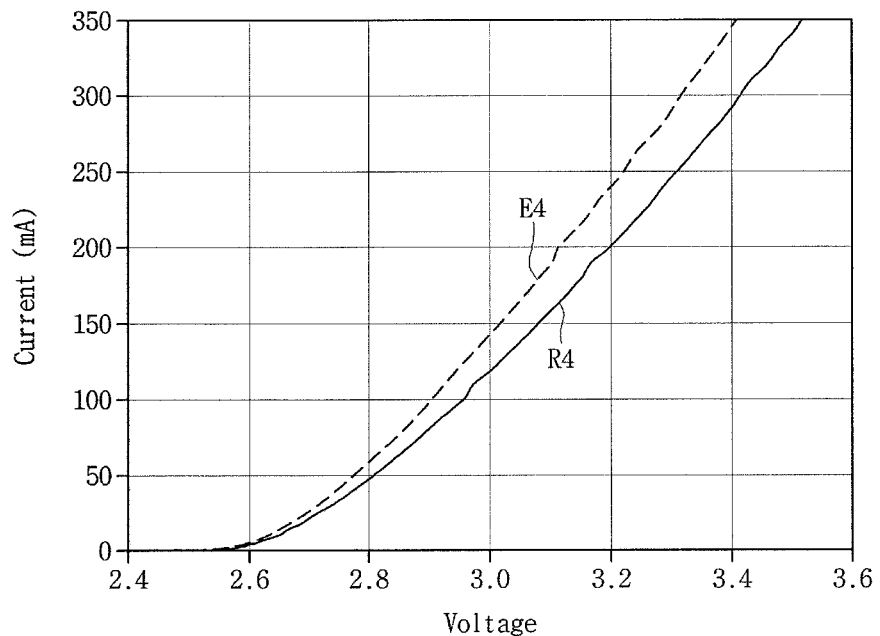
【Figure 6】
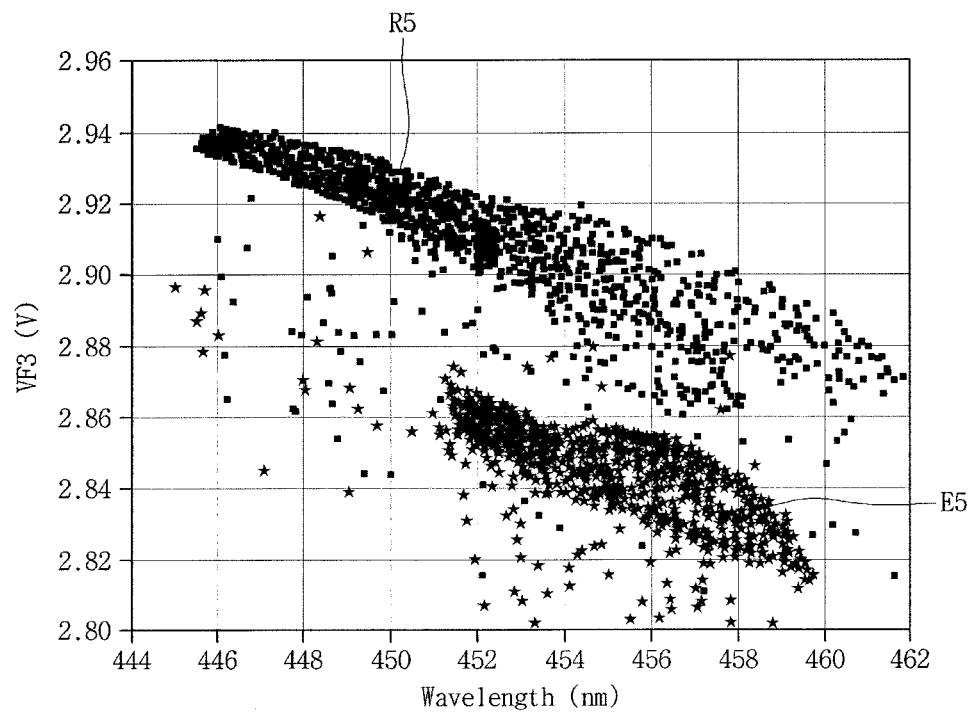

[Figure 7]
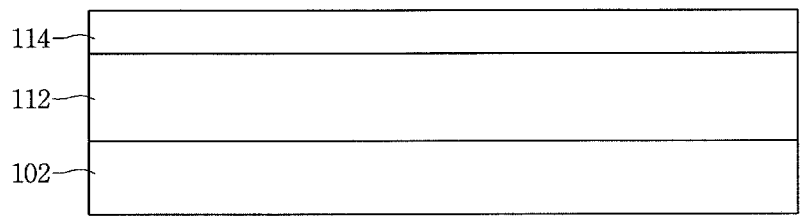
[Figure 8]
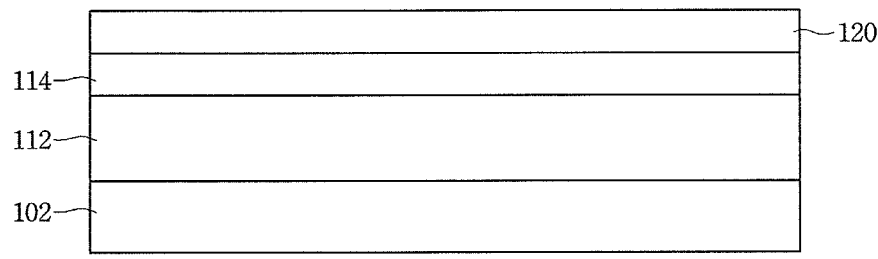
[Figure 9]
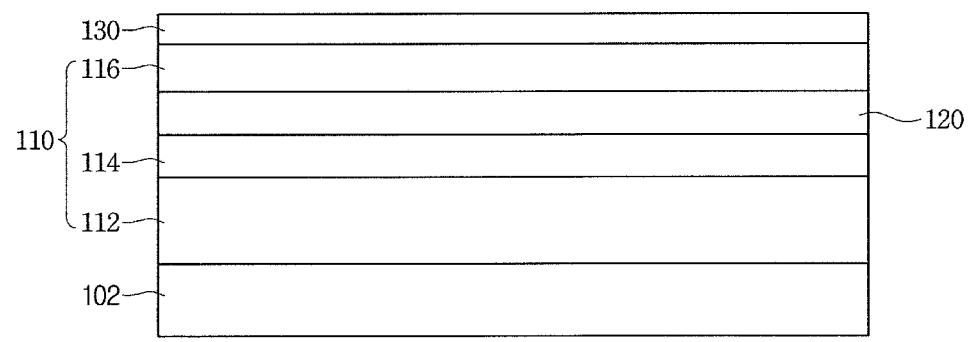

【Figure 10】
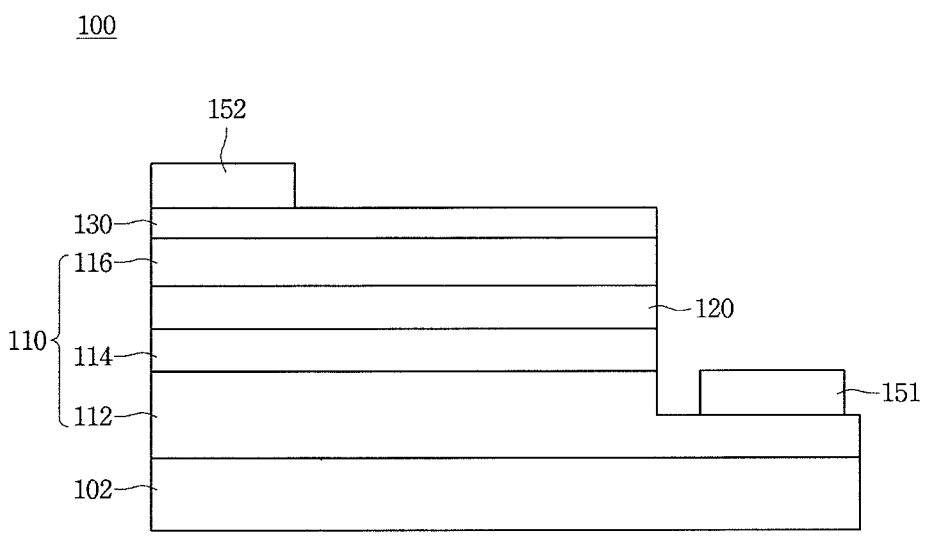
【Figure 11】
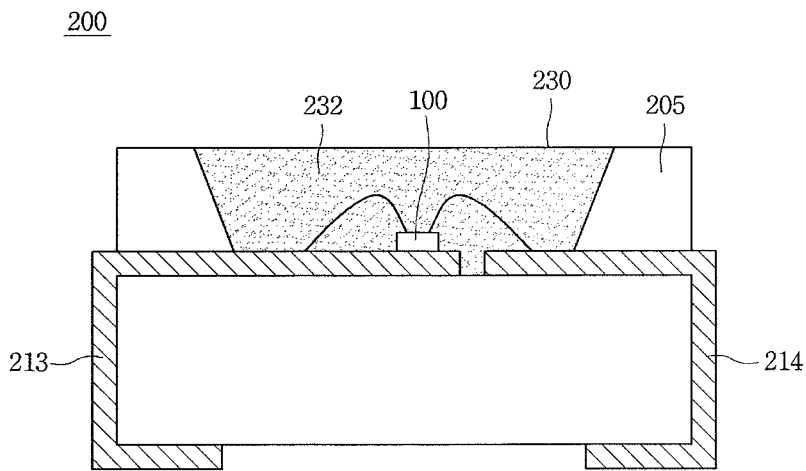

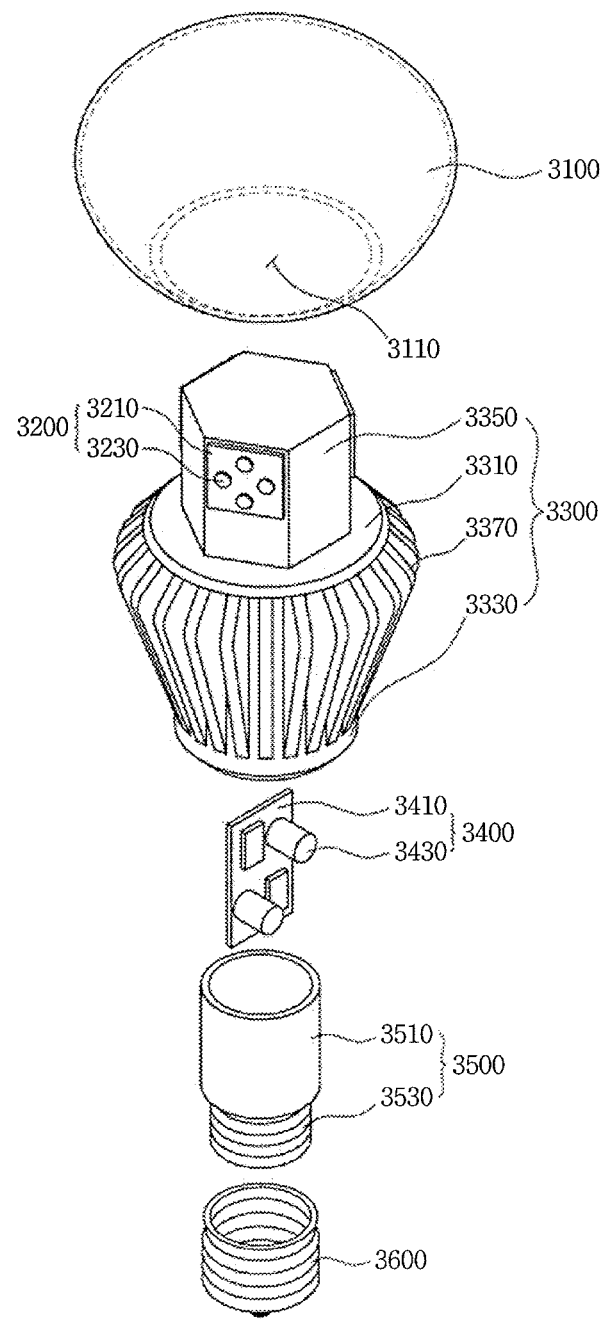
【Figure 12】

LIGHT-EMITTING DEVICE AND LIGHTING SYSTEM COMPRISING SAME

CROSS REFERENCE TO RELATED APPLICATIONS

This application is the National Phase of PCT International Application No. PCT/KR2016/001421, filed on Feb. 12, 2016, which claims priority under 35 U.S.C. 119(a) to Patent Application No. 10-2015-0023144, filed in the Republic of Korea on Feb. 16, 2015, all of which are hereby expressly incorporated by reference into the present application.

TECHNICAL FIELD

The embodiment relates to a light emitting device, a light emitting device package including the same, and a lighting system including the same.

BACKGROUND ART

A light emitting diode (LED) includes a P-N junction diode having a characteristic of converting electric energy into light energy, and may be formed by using compound semiconductors of group III-V elements on the Periodic Table. In addition, the LED may represent various colors realized by adjusting the compositional ratio of the compound semiconductors When forward voltage is applied to the LED, electrons of an N layer are combined with holes of a P layer, so that energy corresponding to an energy bandgap between a conduction band and a valance band may be generated. In the case of the light-emitting device, the energy is generated in the form of light.

A nitride semiconductor represents excellent thermal stability and wide bandgap energy so that the nitride semiconductor has been spotlighted in the field of optical devices and high-power electronic devices. Specifically, blue LEDs, green LEDs, ultra-violet (UV) LEDs using nitride semiconductors are commercialized and widely used.

The LED emits light through the recombination of electrons produced in an N type structure and holes produced in a P type structure.

Meanwhile, since electrons have masses and mobility greater than those of holes, the electrons are prevented from being overflown by using an electron blocking layer including a material, such as P type AlGaN, representing a high potential barrier. However, as the stress occurs due to the lattice mismatch between a barrier of an active layer and the electron blocking layer, the energy band is bent. Accordingly, the injection efficiency of the hole is degraded, so that the light emitting efficiency may be degraded.

DISCLOSURE

Technical Problem

The embodiment provides a light emitting device, a light emitting device package, and a lighting system, capable of improving light efficiency.

Technical Solution

According to the embodiment, the light emitting device may include a first conductivity-type semiconductor layer, an active layer on the first conductivity-type semiconductor layer, an electron blocking layer on the active layer, and a second conductivity-type semiconductor layer on the electron blocking layer. The electron blocking layer may include an $In_xAl_yGa_{1-x-y}N$ based superlattice layer (wherein $0 \leq x \leq 1$, $0 \leq y \leq 1$).

Advantageous Effects

According to the embodiment, hole injection efficiency may be improved by decreasing the bending of an energy band in a valance band.

According to the embodiment, carrier leakage can be minimized by reducing the electrostatic field between the active layer and the electron blocking layer.

DESCRIPTION OF DRAWINGS

FIG. 1 is a sectional view of a light emitting device according to the embodiment.

FIG. 2 is a graph representing an electric field intensity of the light emitting device according to the embodiment.

FIG. 3 is a view illustrating a band diagram of the light emitting device according to the embodiment.

FIG. 4 is a graph illustrating glow discharge spectroscopy (GDS) of the light emitting device according to the embodiment.

FIG. 5 is a graph illustrating the improving in an operating voltage of the light emitting device according to the embodiment.

FIG. 6 is a view illustrating the distribution of indium (In) as a function of a wavelength according to the embodiment.

FIGS. 7 to 10 are views illustrating the fabrication process of the light emitting device according to the embodiment.

FIG. 11 is a sectional view of a light emitting device package according to the embodiment.

FIG. 12 is an exploded perspective view illustrating a lighting system according to embodiments including the light emitting device according to the embodiment.

BEST MODE

Mode for Invention

In the description of the embodiment, it will be understood that, when a layer (or film), an area, a pattern, or a structure is referred to as being "on" or "under" a substrate, each layer (or film), each area, each pad, or patterns, it can be "directly" or "indirectly" over the substrate, or the layer (or film), area, pad, or pattern, or one or more intervening layers may also be present. Such a position of the layer has been described with reference to the drawings.

FIG. 1 is a sectional view of a light emitting device according to the embodiment.

Referring to FIG. 1, according to the embodiment, a light emitting device 100 may include a substrate 102, a light emitting structure 110 including a first conductive-type semiconductor 112 on the substrate 102, an active layer 114 on the first conductive-type semiconductor 112, a second conductive-type semiconductor layer 116 on the active layer 114, and an electron blocking layer 120 disposed between the active layer 114 and the second conductive-type semiconductor layer 116.

According to the embodiment, the electron blocking layer 120 may include an $In_xAl_yGa_{1-x-y}N$ based superlattice layer (wherein, $0 \leq x \leq 1$, $0 \leq y \leq 1$).

According to the embodiment, the light emitting device 100 may include an ohmic layer 130 on the second conductive-type semiconductor layer 116, a second electrode 152 on the ohmic layer 130, and a first electrode 151 electrically connected with the first conductive-type semiconductor 112.

According to the embodiment, in order to provide the light emitting device capable of improving the light emitting efficiency, the $In_xAl_yGa_{1-x-y}N$ based superlattice layer (wherein, $0 \leq x \leq 1$, $0 \leq y \leq 1$) may be disposed between the active layer 114 and the second conductive-type semiconductor layer 116.

According to the embodiment, the light emitting device may be formed in at least one of a lateral-type, a vertical-type, a flip-type, a via-hole-vertical type structures.

FIG. 2 is a graph representing an electric field intensity according to the embodiment.

Referring to 2, reference sign R1 represents a graph illustrating an electric field intensity of an electron blocking layer having an AlGaN composition according to the related art. Reference sign E1 represents a graph illustrating an electric field intensity of an electron blocking layer having the superlattice structure of an $In_xAl_yGa_{1-x-y}N$ layer/$In_xGa_{1-x}N$ layer according to the embodiment.

In the section having the vertical distance ranging from 0.13 µm to 0.14 µm, in detail, the section between the active layer and the electron blocking layer, the embodiment may minimize carrier leakage by decreasing the electric field intensity, as compared with that of the related art.

In addition, in the section having the vertical direction ranging from 0.14 µm to 0.16 µm, in detail, the section of the electron blocking layer, the embodiment has the superlattice structure of the $In_xAl_yGa_{1-x-y}N$ layer/$In_xGa_{1-x}N$ layer to increase a hole carrier concentration, thereby improving the hole injection efficiency, as compared with that of the related art.

FIG. 3 is a view illustrating a band diagram of the light emitting device according to the embodiment.

According to the embodiment, the active layer 114 may include a quantum well 114w/a quantum barrier 114b and may be formed in at least one pair structure of InGaN/GaN, InGaN/InGaN, GaN/AlGaN, InGaN/AlGaN, InAlGaN/GaN, GaAs(InGaAs)/AlGaAs, and GaP(InGaP)/AlGaP, but the embodiment is not limited thereto.

According to the embodiment, a last barrier 115 is disposed between the active layer 114 and the electron blocking layer 120 to prevent the back diffusion of magnesium (Mg).

According to the embodiment, the electron blocking layer 120 of the light emitting device may include an $In_xAl_yGa_{1-x-y}N$ based superlattice layer (wherein, $0 \leq x \leq 1$, $0 \leq y \leq 1$). The $In_xAl_yGa_{1-x-y}N$ based superlattice layer may include the superlattice structure of an $In_xAl_yGa_{1-x-y}N$ layer 120b/$In_zGa_{1-z}N$ layer 120a (wherein, $0 \leq z \leq 1$).

The bandgap energy level of the $In_zGa_{1-z}N$ layer 120a may be set higher than a bandgap energy level of the quantum well 114b of the active layer to prevent electrons from being overflown, thereby improving the light emitting efficiency.

According to the embodiment, the In concentration x of the $In_xAl_yGa_{1-x-y}N$ based superlattice layer may be in the range of 0.01 to 0.03, preferably, may be 0.016, but the embodiment is not limited thereto. In detail, if the In concentration x of the $In_xAl_yGa_{1-x-y}N$ based superlattice layer is less than 0.01, the effect of decreasing the bending of an energy band may be lowered due to a lattice constant difference from the active layer 114. If the In concentration x of the $In_xAl_yGa_{1-x-y}N$ based superlattice layer exceeds 0.03, the effect of decreasing the carrier leakage may be lowered.

The Al concentration y of the $In_xAl_yGa_{1-x-y}N$ based superlattice layer may be in the range of 0.15 to 0.2, preferably, may be 0.18, but the embodiment is not limited thereto. If the Al concentration y of the $In_xAl_yGa_{1-x-y}N$ based superlattice layer is less than 0.15, as the energy bandgap is lowered, the overflow of the electrons is increased. Accordingly, an electron blocking effect may be lowered. If the Al concentration y of the $In_xAl_yGa_{1-x-y}N$ based superlattice layer exceeds 0.2, as the energy bandgap is increased, the mobility of holes to the active layer may be lowered.

According to the embodiment, the thickness of the $In_xAl_yGa_{1-x-y}N$ layer 120b may be in the range of 1.5 nm to 2 nm, but the embodiment is not limited thereto. In detail, if the thickness of the $In_xAl_yGa_{1-x-y}N$ layer 120b is less than 1.5 nm, the electron blocking effect may be lowered. If the thickness of the $In_xAl_yGa_{1-x-y}N$ layer 120b exceeds 2 nm, the thickness of the electron blocking layer may be increased. Accordingly, the light emitting efficiency may be degraded.

The thickness of the $In_zGa_{1-z}N$ layer 120a may be in the range of 1.5 nm to 3 nm, but the embodiment is not limited thereto. In detail, if the thickness of the $In_zGa_{1-z}N$ layer 120a is less than 1.5 nm, an electron blocking function may be degraded. If the $In_zGa_{1-z}N$ layer 120a exceeds 3 nm, the thickness of the electron blocking layer is significantly increased, so that the light emitting efficiency may be degraded.

The $In_xAl_yGa_{1-x-y}N$ based superlattice layer may include 10 pairs to 15 pairs of an $In_xAl_yGa_{1-x-y}N$ layer 120b/an $In_zGa_{1-z}N$ layer 120a, but the embodiment is not limited thereto.

According to the embodiment, the active layer 114 may have the last barrier 115. According to the embodiment, although the last barrier 115 is not intentionally doped with dopants, the last barrier 115 may include an unintentionally-doped dopant layer by the diffusion of dopants doped into layers formed in the subsequent processes. The doping concentration of the unintentionally-doped dopant layer may be in the range of about $1 \times 10^{17}$ to about $1 \times 10^{18}$ (atoms/cm$^3$). The doping concentration of the unintentionally-doped dopant layer may be in the range of about $3 \times 10^{17}$ to about $8 \times 10^{17}$ (atoms/cm$^3$).

The last barrier 115 may include GaN, and the thickness of the last barrier 115 may be about 10 nm, but the embodiment is not limited thereto. The energy bandgap of the last barrier 115 may be equal to that of the quantum barrier 114b of the active layer. In other words, according to the light emitting device of the embodiment, the last barrier 115 may be disposed between the active layer 114 and the electron blocking layer 120, thereby preventing the back diffusion of Mg.

In other words, according to the light emitting device of the embodiment, the $In_xAl_yGa_{1-x-y}N$ based superlattice layer of the electron blocking layer 120 is realized in the superlattice structure of the $In_xAl_yGa_{1-x-y}N$ layer/$In_xGa_{1-x}N$ layer to improve a hole carrier concentration, thereby improving the hole injection efficiency.

FIG. 4 is a graph illustrating glow discharge spectroscopy (GDS) of the light emitting device, according to the embodiment.

Referring to FIG. 4, reference sign R2 represents a graph illustrating the Al concentration of the electron blocking layer having an AlGaN composition according to the related art. Reference sign R3 represents a graph illustrating the concentration of Mg doped into the electron blocking layer having the AlGaN composition according to the related art.

In addition, reference sign E2 represents a graph illustrating the Al concentration of the electron blocking layer including the $In_xAl_yGa_{1-x-y}N$ layer 120b/$In_zGa_{1-z}N$ layer 120a according to the embodiment. Reference sign E3 represents a graph illustrating the concentration of Mg doped into the electron blocking layer according to the embodiment.

Accordingly, the electron blocking layer according to the related art is the section having the depth of 0.035 to 0.08 corresponding to the sections of the reference signs R2 (Al) and R3 (Mg) in which concentration is constantly maintained. The electron blocking layer according to the embodiment is the section having the depth of 0.035 to 0.06 corresponding to the sections of the reference signs E2 (Al) and E3 (Mg) in which concentration is constantly maintained. It can be recognized from FIG. 4 that the thickness of the electron blocking layer according to the embodiment is reduced by 0.02 μm. In other words, according to the embodiment, the doping efficiency of Mg may be improved as compared with that of the related art and thus the thickness of the electron blocking layer may be reduced.

FIG. 5 is a graph illustrating the improving in an operating voltage of the light emitting device according to the embodiment.

Referring to FIG. 5, reference sign R4 represents the graph of the operating voltage according to the related art. In detail, when current of 60 mA flows, the operating voltage is 2.83 V. Reference sign E4 represents the graph of the operating voltage according to the embodiment. In detail, when the current of 60 mA flows, the operating voltage is 2.81 V, which is reduced by 0.02 V. In other words, according to the embodiment, the operating voltage may be more improved as compared with that of the related art.

FIG. 6 is a view illustrating the distribution of In as a function of a wavelength, according to the embodiment.

Referring to FIG. 6, reference sign R5 represents a graph illustrating the distribution of In as a function of a wavelength according to the related art, and reference sign E5 represents a graph illustrating the distribution of In as a function of a wavelength according to the embodiment.

In detail, in reference sign R5, the operating voltage is 2.90 V at the wavelength of 452 nm. In reference sign E5, the operating voltage is 2.86 V at the wavelength of 452 nm.

In other words, according to the embodiment, the operating voltage may be more improved as compared with that of the related art.

FIGS. 7 to 10 are views illustrating the fabrication process of the light emitting device, according to the embodiment.

Hereinafter, the technical features of the embodiment will be described in detail by describing a method of fabricating a light emitting device according to the embodiment with reference to FIGS. 7 to 10.

First, as shown in FIG. 7, the substrate 102 is provided. The substrate 102 may be formed of a material having excellent thermal conductivity. The substrate 102 may be a conductive substrate or an insulating substrate.

For example, the substrate 102 may include at least one of sapphire ($Al_2O_3$), SiC, Si, GaAs, GaN, ZnO, GaP, InP, Ge, and $Ga_2O_3$. A concavo-convex structure may be formed on the substrate 102, but the embodiment is not limited thereto.

In this case, a buffer layer (not shown) may be formed on the substrate 102. The buffer layer may reduce the lattice mismatch between the substrate 102 and the material of the light emitting structure 110 which may be formed in the subsequence process. The material of the buffer layer may include a group III-V compound semiconductor. In detail, the material of the buffer layer may include at least one of GaN, InN, AlN, InGaN, AlGaN, InAlGaN, and AlInN.

Next, the light emitting structure 110 including the first conductive-type semiconductor 112, the active layer 114, and the second conductive-type semiconductor layer 116 may be formed on the substrate 102.

First, the first conductive-type semiconductor 112 may be realized with a semiconductor compound, for example, a compound semiconductor belonging to a group III-V or a group II-VI. The first conductive-type semiconductor 112 may be doped with first conductive-type dopants. When the first conductive-type semiconductor 112 is an N type semiconductor, the first conductive dopant serves as an N type dopant, such as Si, Ge, Sn, Se, or Te, but the embodiment is not limited thereto.

The first conductive-type semiconductor 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 114 is formed on the first conductive-type semiconductor layer 112.

The active layer 114 may be formed in at least one of a single quantum well structure, a multi-quantum well structure (MQW), a quantum wire structure, or a quantum dot structure.

For example, the active layer 114 may have the MQW structure formed by introducing trimethyl gallium (TMGa) gas, ammonia ($NH_3$) gas, nitrogen ($N_2$) gas, and trimethyl indium (TMIn) gas, but the embodiment is not limited thereto.

According to the embodiment, the quantum well 114w/the quantum barrier 114b of the active layer 114 may include at least one pair structure of InGaN/GaN, InGaN/InGaN, GaN/AlGaN, InGaN/AlGaN, InAlGaN/GaN, GaAs(InGaAs)/AlGaAs, and GaP(InGaP)/AlGaP, but the embodiment is not limited thereto.

Next, as shown in FIG. 8, the electron blocking layer 120 may be formed on the active layer 114. The electron blocking layer 120 may include the $In_xAlyGa_{1-x-y}N$ based superlattice layer (wherein, $0 \le x \le 1$, $0 \le y \le 1$)

For example, as shown in FIG. 3, according to the embodiment, the $In_xAl_yGa_{1-x-y}N$ based superlattice layer 120 may be formed in the superlattice structure of the $In_xAl_yGa_{1-x-y}N$ layer 120b/the $In_zGa_{1-z}N$ layer 120a (wherein, $0 \le z \le 1$).

Next, as shown in FIG. 9, the second conductive-type semiconductor layer 116 may be formed on the electron blocking layer 120. The second conductive-type semiconductor layer 116 may include a semiconductor material having the composition formula of $In_xAl_yGa_{1-x-y}N$ ($0 \le x \le 1$, $0 \le y \le 1$, $0 \le x+y \le 1$).

If the second conductive-type semiconductor layer 116 is a P type semiconductor, the second conductive dopant may serve as a P type dopant, such as Mg, Zn, Ca, Sr, or Ba.

According to the embodiment, the first conductive-type semiconductor 112 may be realized as an N type semiconductor layer, and the second conductive-type semiconductor layer 116 may be realized as a P type semiconductor, but the embodiment is not limited thereto.

In addition, a semiconductor having a polarity opposite to a polarity of the second conductive type, in detail, an N type semiconductor layer (not shown) may be formed on the second conductive-type semiconductor layer 116. Accordingly, the light emitting structure 110 may include one of an N-P junction structure, a P-N junction structure, an N-P-N junction structure, and a P-N-P junction structure.

Next, the ohmic layer 130 may be formed on the second conductive-type semiconductor layer 116.

For example, the ohmic layer 130 may be formed by laminating single metal or a metal alloy, a metal oxide, and the like in a multi-layer such that hole injection may be efficiently performed.

For example, the ohmic layer 130 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Al, Rh, Pd, Ir, Ru, Mg, Zn, Pt, Au, and Hf, but the embodiment is not limited thereto.

Next, as shown in FIG. 10, portions of the ohmic layer 130, the second conductive-type semiconductor layer 116, the electron blocking layer 120, and the active layer 114 are removed to expose a portion of the top surface of the first conductive-type semiconductor layer 112.

Next, the second electrode 152 is formed on the ohmic layer 130 and the first electrode 151 is formed on the exposed portion of the first conductive-type semiconductor layer 112, thereby forming the light emitting device according to the embodiment.

FIG. 11 is a sectional view of a light emitting device package according to the embodiment.

A light emitting device package 200 according to the embodiment may have the light emitting device having the above-described structure.

The light emitting device package 200 may include a package body part 205, first and second lead frames 213 and 214 mounted on the package body part 205, a light emitting device 100 mounted on the package body part 205 and electrically connected with the first and second lead frames 213 and 214, and a molding member 230 having and surrounding the light emitting device 100.

The package body part 205 may include silicon, synthetic resin, or metal, and may have inclined surfaces formed around the light emitting device 100.

The first and second lead frames 213 and 214 are electrically insulated from each other, and supply power to the light emitting device 100. The first and second lead frames 213 and 214 may reflect light emitted from the light emitting device 100 to increase light efficiency, and may discharge heat emitted from the light emitting device 100 to the outside The light emitting device 100 may be provided on the package body part 250 or may be provided on the first lead frame 213 or the second lead frame 214.

The light emitting device 100 may be electrically connected to the first lead frame 213 and/or the second lead frames 214 through a wire manner, a flip-chip manner or a die bonding manner. According to the embodiment although the light emitting device 100 may be electrically connected to the first lead frame 213 and the second lead frame 214 through wires, respectively, but the embodiment is not limited thereto.

The molding member 230 may surround the light emitting device 100 to protect the light emitting device 100. The molding member 230 may include a phosphor 232 to change the wavelength of the light emitted from the light emitting device 100.

As shown in FIG. 12, a lighting system according to the embodiment may include a cover 3100, a light source part 3200, a radiator 3300, a circuit part 3400, an inner case 3500, and a socket 3600. The light source part 3200 may include the light emitting device or a light device package according to the embodiment.

The cover 3100 may have a blub shape and have a hollow structure. The cover 3100 has an opening 3110. The light source part 3200 and a member 3350 may be inserted through the opening 3110.

The cover 3100 may be coupled to the radiator 3300, and may surround the light source part 3200 and the member 3350. The light source part 3200 and the member 3350 may be blocked from the outside by the coupling between the cover 3100 and the radiator 3300. The cover 3100 may be coupled to the radiator 3300 by an adhesive or various manners such as a rotation coupling manner and a hook coupling manner. The rotation coupling manner is to couple a thread of the cover 3100 to a screw groove of the radiator 3300, and the cover 3100 is coupled to the radiator 3300 by rotation of the cover 3100. The hook coupling manner is to insert a step of the cover 3100 into a groove of the radiator 3300 so that the cover 3100 is coupled to the radiator 3300.

The cover 3100 may be optically coupled to the light source part 3200. In detail, the cover 3100 may diffuse, scatter, or excite light emitted from a light emitting device 3230 of the light source part 3200. The cover 3100 may be a type of an optical member. The cover 3100 may be provided at an inner/outer surface or an inside thereof with a phosphor in order to excite the light supplied from the light source part 3200.

The cover 3100 may include an inner surface coated with a milk-white paint. The milk-white paint may include a diffusion material to diffuse light. The cover 3100 may have the inner surface of which is greater than the outer surface thereof in surface roughness. The surface roughness is provided for the purpose of sufficiently scattering and diffusing the light from the light source part 3200.

A material of the cover 3100 may include glass, plastic, polypropylene (PP), polyethylene (PE), and polycarbonate (PC). The polycarbonate (PC) has the excellent light resistance, heat resistance and strength among the above materials. The cover 3100 may include a transparent material allowing a user to view the light source part 3200 and the member 3350 from the outside, or an opaque material to prevent the light source part 3200 and the member 3350 from being viewed. The cover 3100 may be formed through a blow molding scheme.

The light source part 3200 may be provided at the member 3350 of the radiator 3300, and a plurality of light source parts may be provided. In detail, the light source part 3200 may be provided on at least one of a plurality of lateral sides of the member 3350. In addition, the light source part 3200 may be provided on an upper end of the lateral side of the member 3350.

The light source part 3200 may be provided at three of six lateral sides of the member 3350, but the embodiment is not limited thereto. In other words, the light source part 3200 may be provided at all lateral sides of the member 3350. The light source part 3200 may include a substrate 3210 and a light emitting device 3230. The light emitting device 3230 may be provided on one surface of the substrate 3210.

The substrate 3210 has a rectangular plate shape, but the embodiment is not limited thereto. The substrate 3210 may have various shapes. For example, the substrate 3210 may have a circular plate shape or a polygonal plate shape. The substrate 3210 may be provided by printing a circuit pattern on an insulator. For example, the substrate 3210 may include a typical printed circuit board (PCB), a metal core PCB, a flexible PCB, and a ceramic PCB. In addition, the substrate may have a COB (chips on board) type in which LED chips, which are not packaged, are directly bonded on the PCB. In addition, the substrate 3210 may include a material to effectively reflect light, or the surface of the substrate may have a color, such as a white color or a silver color, to effectively reflect the light. The substrate 3210 may be electrically connected to the circuit part 3400 received in the radiator 3300. For example, the substrate 3210 and the circuit part 3400 may be connected to each other by a wire. The wire may connect the substrate 3210 and the circuit part 3400 to each other through the radiator 3300.

The light emitting device 3230 may include a light emitting diode chip to emit red, green, and blue lights or a light emitting device chip to emit UV. The light emitting diode chip may have the lateral type or the vertical type. The light emitting diode chip may emit one of blue, red, yellow, and green lights.

The light emitting device 3230 may have a phosphor. The phosphor may include at least one of garnet-based phosphors (YAG, or TAG), silicate-based phosphors, nitride-based phosphors, and oxynitride-based phosphors. The phosphor may include at least one of yellow, green, and red phosphors.

The radiator 3300 is coupled to the cover 3100 to radiate heat from the light source part 3200. The radiator 330 has a predetermined volume, and includes a top surface 3310 and a lateral side 3330. The member 3350 may be provided on the top surface 3310 of the radiator 3310. The top surface 3310 of the radiator 3300 may be coupled to the cover 3100. The top surface 3310 of the radiator 3300 may have a shape corresponding to an opening 3110 of the cover 3100.

A plurality of heat radiation pins 3370 may be provided at the lateral side 3330 of the radiator 3300. The heat radiation pin 3370 may extend outward from the lateral side 3330 of the radiator 3300 or may be connected to the lateral side 3330 of the radiator 3300. The heat radiation pin 3370 may improve heat radiation efficiency by widening a heat radiation area of the radiator 3300. The lateral side 3330 may not include the heat radiation pin 3370.

The member 3350 may be provided on the top surface of the radiator 3300. The member 3350 may be integrated with or coupled to the top surface 3310 of the radiator 3300. The member 3350 may have the shape of a polygonal prism. In detail, the member 3350 may have the shape of a polygonal prism. The member 3350 having the shape of a polygonal prism includes a top surface, a bottom surface, and six lateral sides. The member 3350 may have the shape of a circular prism or the shape of an elliptical prism as well as the shape of a polygonal prism. When the member 3350 has the shape of a circular prism or the shape of an elliptical prism, the substrate 3210 of the light source part 3200 may be a flexible substrate.

The light source part 3200 may be provided at six lateral sides of the member 3350. The light source part 3200 may be provided at all or some of the six lateral sides of the member 3350. The light source part 3200 is provided at three of the six lateral sides of the member 3350 as shown in FIG. 11.

The substrate 3210 is provided at the lateral side of the member 3350. The lateral side of the member 3350 may be substantially vertical to the top surface 3310 of the radiator 3300. Accordingly, the substrate 3210 and the top surface of the radiator 3300 may be substantially vertical to each other.

The member 3350 may include a material representing thermal conductivity. Thus, heat from the light source part 3200 can be rapidly transferred to the member 3350. For example, the material for the member 3350 may include aluminum (Al), nickel (Ni), copper (Cu), magnesium (Mg), silver (Ag), tin (Sn), and the alloy thereof. The member 3350 may include a plastic having thermal conductivity. The plastic having thermal conductivity is lighter than the metal and has thermal conductivity in a single direction.

The circuit part 3400 receives power from the outside, and converts the received power suitably for the light source part 3200. The circuit part 3400 provides the converted power to the light source part 3200. The circuit part 3400 may be provided in the radiator 3300. In detail, the circuit part 3400 may be received in the internal case 3500 or may be received in the radiator 3300 together with the internal case 3500. The circuit part 3400 may include a circuit substrate 3410 and a plurality of components 3430 mounted on the circuit substrate 3410.

The circuit board 3410 has a circular plate shape, but the embodiment is not limited thereto. For example, the circuit board 3410 may have various shapes. For example, the circuit board 3410 may have an oval plate shape or a polygonal plate shape. The circuit board 3410 may be provided by printing a circuit pattern on an insulator.

The circuit board 3410 is electrically connected with the substrate 3210 of the light source part 3200. For example, the circuit board 3410 and the substrate 3210 may be electrically connected to each other by a wire. The wire may be provided inside the radiator 3300 to connect the substrate 3210 with the circuit board 3410.

For example, a plurality of components 3430 may include a direct current converter to convert AC power provided from an external power supply into DC power, a driving chip to control the driving of the light source part 3200, and an electrostatic discharge (ESD) protection device to protect the light source part 3200.

The inner case 3500 receives the circuit part 3400 therein. The inner case 3500 may include a receiving part 3510 to receive the circuit part 3400.

For example, the receiving part 3510 may have a cylindrical shape. The shape of the receiving part 3510 may be varied depending on the shape of the radiator 3300. The inner case 3500 may be received in the radiator 3300. The receiving part 3510 of the inner case 3500 may be received in a receiving part which is formed at a bottom surface of the radiator 3300.

The inner case 3500 may be coupled to the socket 3600. The inner case 3500 may include a connecting part 3530 coupled to the socket 3600. The connecting part 3530 may have a thread structure corresponding to a screw groove structure of the socket 3600. The inner case 3500 is an insulator. Accordingly, the inner case 3500 prevents electric short between the circuit part 3400 and the radiator 3300. For example, the inner case 3500 may include a plastic or resin material.

The socket 3600 may be coupled to the inner case 3500. In detail, the socket 3600 may be coupled to the connecting part 3530 of the inner case 3500. The socket 3600 may have the same structure as that of a conventional incandescent light bulb. The socket 3600 is electrically connected with the circuit part 3400. For example, the circuit part 3400 and the socket 3600 may be electrically connected to each other by a wire. If external power is applied to the socket 3600, the external power may be transferred to the circuit part 3400. The socket 3600 may have a screw groove structure corresponding to a thread structure of the connecting part 3550.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Accordingly, such combinations and modifications should be interpreted as falling within the technical scope of the embodiment.

Although embodiments have been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The light emitting device according to the embedment may be provided in the form of the backlight unit and may be utilized to the lighting system. The lighting system may include a lighting unit, an indicator, a lamp, or a street lamp.

The invention claimed is:

1. A light emitting device comprising:
a first conductive-type semiconductor layer;
an active layer on the first conductive-type semiconductor layer;
an electron blocking layer on the active layer; and
a second conductive-type semiconductor layer on the electrode blocking layer,
wherein the electron blocking layer comprises an $In_xAl_yGa_{1-x-y}N$ based superlattice layer (wherein $0 \leq x<1$, $0<y \leq 1$),
wherein the $In_xAl_yGa_{1-x-y}N$ based superlattice layer includes a superlattice structure of an $In_xAl_yGa_{1-x-y}N$ layer/an $In_zGa_{1-z}N$ layer (wherein $0 \leq z \leq 1$),
wherein the $In_xAl_yGa_{1-x-y}N$ based superlattice layer has an indium (In) concentration in a range of 0.01 to 0.03, and
wherein the $In_xAl_yGa_{1-x-y}N$ based superlattice layer has an aluminum (Al) concentration in a range of 0.15 to 0.2.

2. The light emitting device of claim 1, wherein the $In_xAl_yGa_{1-x-y}N$ layer has a thickness in a range of 1.5 nm to 2 nm.

3. The light emitting device of claim 1, wherein the $In_zGa_{1-z}N$ layer has a thickness in a range of 1.5 nm to 3 nm.

4. The light emitting device of claim 1, wherein the $In_xAl_yGa_{1-x-y}N$ based superlattice layer includes the $In_xAl_yGa_{1-x-y}N$ layer/the $In_zGa_{1-z}N$ layer.

5. The light emitting device of claim 1, wherein the $In_xAl_yGa_{1-x-y}N$ based superlattice layer has 10 pair to 15 pair of an $In_xAl_yGa_{1-x-y}N/In_zGa_{1-z}N$ layer.

6. The light emitting device of claim 1, further comprising:
a last barrier in the active layer,
wherein the last barrier includes only GaN.

7. The light emitting device of claim 6, wherein a material of the last barrier has an energy bandgap equal to an energy bandgap of a quantum barrier of the active layer.

8. The light emitting device of claim 6, wherein the last barrier includes an undoped layer or an unintentionally-doped dopant layer.

9. The light emitting device of claim 8, wherein, in the unintentionally-doped dopant layer, a doping concentration of dopants is in a range of $1 \times 10^{17}$ to $1 \times 10^{18}$ (atoms/cm$^3$).

10. The light emitting device of claim 8, wherein, in the unintentionally-doped dopant layer, a doping concentration of dopants is in a range of $3 \times 10^{17}$ to $8 \times 10^{18}$ (atoms/cm$^3$).

11. The light emitting device of claim 6, wherein the $In_zGa_{1-z}N$ layer has a bandgap energy level higher than a bandgap energy level of a quantum well of the active layer to prevent electrons from being overflown.

12. The light emitting device of claim 1, wherein a last barrier is provided between the active layer and the electron blocking layer to prevent back diffusion of magnesium (Mg).

13. The light emitting device of claim 1, wherein the $In_zGa_{1-z}N$ layer has a bandgap energy level higher than a bandgap energy level of a quantum barrier of the active layer.

14. The light emitting device of claim 1, wherein $0<z \leq 1$.

15. The light emitting device of claim 1, wherein the active layer includes a quantum well and a quantum barrier and is formed in at least one pair structure of InGaN/GaN, GaN/AlGaN, InGaN/AlGaN, InAlGaN/GaN, GaAs(InGaAs)/AlGaAs, and GaP(InGaP)/AlGaP.

16. A lighting system comprising:
a socket;
a cover on the socket;
a radiator disposed between the socket and the cover; and
at least a light emitting device including:
a first conductive-type semiconductor layer;
an active layer on the first conductive-type semiconductor layer;
an electron blocking layer on the active layer; and
a second conductive-type semiconductor layer on the electrode blocking layer,
wherein the electron blocking layer comprises an $In_xAl_yGa_{1-x-y}N$ based superlattice layer (wherein, $0 \leq x<1$, $0<y \leq 1$),
wherein the $In_xAl_yGa_{1-x-y}N$ based superlattice layer includes a superlattice structure of an $In_xAl_yGa_{1-x-y}N$ layer/an $In_zGa_{1-z}N$ layer (wherein $0 \leq z \leq 1$),
wherein the $In_xAl_yGa_{1-x-y}N$ based superlattice layer has an indium (In) concentration in a range of 0.01 to 0.03, and
wherein the $In_xAl_yGa_{1-x-y}N$ based superlattice layer has an aluminum (Al) concentration in a range of 0.15 to 0.2.

17. The light emitting device of claim 16, wherein $0<z \leq 1$.

18. The light emitting device of claim 16, wherein the active layer includes a quantum well and a quantum barrier and is formed in at least one pair structure of InGaN/GaN, GaN/AlGaN, InGaN/AlGaN, InAlGaN/GaN, GaAs(InGaAs)/AlGaAs, and GaP(InGaP)/AlGaP.

* * * * *